(12) United States Patent
Morita

(10) Patent No.: US 7,569,936 B2
(45) Date of Patent: Aug. 4, 2009

(54) SEMICONDUCTOR DEVICE AND METHOD OF MANUFACTURING THE SAME

(75) Inventor: Takeshi Morita, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/766,471

(22) Filed: Jan. 29, 2004

(65) Prior Publication Data

US 2005/0093165 A1    May 5, 2005

(30) Foreign Application Priority Data

Oct. 30, 2003    (JP) ............................. 2003-370060

(51) Int. Cl.
*H01L 23/52* (2006.01)

(52) U.S. Cl. .................. 257/758; 257/773; 257/786; 257/E23.151; 257/E23.175

(58) Field of Classification Search ................ 257/758, 257/725, 773, 786, E23.151, E23.175; 438/669, 438/926
See application file for complete search history.

(56) References Cited

U.S. PATENT DOCUMENTS

| | | | | |
|---|---|---|---|---|
| 6,099,992 A * | 8/2000 | Motoyama et al. | ............. | 430/5 |
| 6,197,689 B1 * | 3/2001 | Tabara | ................. | 438/688 |
| 6,335,560 B1 * | 1/2002 | Takeuchi | ............. | 257/620 |
| 6,388,341 B2 * | 5/2002 | Arai et al. | ............. | 257/797 |
| 6,486,565 B2 * | 11/2002 | Miyako | ............. | 257/797 |
| 6,504,254 B2 * | 1/2003 | Takizawa | ............. | 257/758 |
| 6,522,007 B2 * | 2/2003 | Kouno et al. | ............. | 257/758 |
| 6,693,357 B1 * | 2/2004 | Borst et al. | ............. | 257/773 |
| 6,833,622 B1 * | 12/2004 | Zagrebelny et al. | ......... | 257/752 |
| 2002/0014697 A1 * | 2/2002 | Tamaoka et al. | ............. | 257/758 |
| 2003/0039897 A1 | 2/2003 | Morita | | |

FOREIGN PATENT DOCUMENTS

| | | |
|---|---|---|
| JP | 9-306910 | 11/1997 |
| JP | 2000-58547 | 2/2000 |
| JP | 2001-313293 | 11/2001 |
| JP | 2003-140319 | 5/2003 |
| JP | 2003-197756 | 7/2003 |

\* cited by examiner

*Primary Examiner*—Matthew E Warren
(74) *Attorney, Agent, or Firm*—Wenderoth, Lind & Ponack, L.L.P.

(57) ABSTRACT

A semiconductor device which is capable of avoiding an increase in pattern ratio and allowing wiring dummy patterns to improve global steps developed by CMP upon insertion of the dummy patterns which are different from an actual wiring pattern. The semiconductor device has a configuration wherein a gate wiring pattern is formed on a semiconductor substrate, a plurality of dummy patterns are provided therearound, and a BPSG oxide film which is flattened by CMP is formed on the gate wiring pattern and the dummy patterns as an interlayer insulating film. In the semiconductor device, the dummy patterns are formed so as to include pattern non-forming regions such as slits.

6 Claims, 5 Drawing Sheets

SEMICONDUCTOR DEVICE AND METHOD OF MANUFACTURING THE SAME

BACKGROUND OF THE INVENTION

1. Field of the Invention

The present invention relates to a semiconductor device wherein dummy patterns are formed on a semiconductor substrate together with a wiring pattern, and to a method of manufacturing the semiconductor device.

2. Description of the Related Art

In an interlayer film CMP (Chemical mechanical polishing) process, batch polishing has heretofore been performed to reach an intended or target remaining film thickness set value. When, at this time, a polishing pad which is brought into contact with the surface of a wafer is elastically deformed due to pressure from an underlying step at an initial polishing stage, the pressure that is applied from the polishing pad increases when a pattern density is low, whereas the pressure that is applied from the polishing pad is dispersed and becomes low when the pattern density is high, thus causing a difference in the polishing rate between loose and dense wiring pattern portions.

Thus, the remaining film thickness differences (hereinafter might be called "global steps") occur among the loose and dense wiring pattern portions after polishing. Each of the global steps consists of a difference in film thickness at the loosest portion and the densest portion of the underlying wiring pattern. The global steps are different from one another according to a wiring layout. Therefore, when the global step is large in the interlayer film CMP process, the underlying wiring pattern is exposed or disappears at the loose portion of the underlying wiring pattern, and the residual step occurs due to cutting insufficiency at the dense portion of the underlying wiring pattern.

When such exposure, disappearance and residual steps of the underlying wiring pattern occur, no wiring is formed upon forming each wiring in a subsequent process, thus causing degradation in yield and reliability.

Therefore, dummy patterns (pseudo dummy patterns) which are different from an actual wiring pattern are inserted into the entire surface of a chip to set the global steps as low as possible (refer to, for example, a patent document: Japanese Unexamined Patent Publication No. 2003-140319). The global steps vary depending on whether the dummy patterns exist. The insertion of the dummy patterns provides an improvement in the global step.

However, a disadvantage occurs in that when the dummy patterns are inserted, a pattern ratio (pattern proportion) of a mask becomes too large to carry out an end point detector (EPD) upon etching at the formation of a wiring pattern. Therefore, there is a demand for suppressing the insertion of the dummy patterns as low as practicable to thereby reduce the global steps.

While the dummy patterns may preferably be inserted to improve the global steps in this way, a disadvantage occurs in that when the pattern ratio become excessively large, EPD cannot be detected upon etching of the wiring pattern.

SUMMARY OF THE INVENTION

In view of the foregoing problems, the present invention therefore provides a semiconductor device which is capable of avoiding an increase in pattern ratio and allowing wiring dummy patterns to improve global steps developed by CMP upon the insertion of the dummy patterns which are different from an actual wiring pattern, and a method of manufacturing the semiconductor device.

The above-described problems are solved by the following aspects of the present invention:

A semiconductor device of the present invention comprises a wiring pattern and a plurality of dummy patterns which are different from the wiring pattern, and an insulating film which is formed on the wiring pattern and the dummy patterns by a chemical vapor deposition method. The dummy patterns are provided with pattern non-forming regions each having a width which is filled by plus sizing of the insulating film upon formation of the insulating film.

The pattern non-forming regions of the dummy patterns may be formed in stripe form or may be formed in character or graphical form.

In the semiconductor device of the present invention, the pattern non-forming regions of the dummy patterns may preferably be shaped in character or graphical forms which are different for each dummy pattern.

In the semiconductor device of the present invention, the dummy patterns may preferably be square. Also, the dummy patterns may preferably be arranged in lattice form.

The present invention also provides a method of manufacturing a semiconductor device, which comprises the following steps of: forming a wiring pattern; forming a plurality of dummy patterns which are different from the wiring pattern together with the wiring pattern; and forming an insulating film on the wiring pattern and the dummy patterns by a chemical vapor deposition method.

In the dummy pattern forming step, the dummy patterns are formed so as to be provided with pattern non-forming regions each having a width which is filled by plus sizing of the insulating film upon formation of the insulating film.

In the dummy pattern forming step, the pattern non-forming regions of the dummy patterns may be formed in stripe form or may be formed in character or graphical form.

In the dummy pattern forming step, the pattern non-forming regions of the dummy patterns may preferably be shaped in character or graphical forms which are different for each dummy pattern.

In the dummy pattern forming step, the dummy patterns may be shaped in square form. Also, the dummy patterns may be arranged and formed in lattice form.

In the present invention, dummy patterns formed together with a wiring pattern are respectively provided with pattern non-forming regions each having a predetermined width. The predetermined width of the pattern non-forming region is defined as a width which is filled with an insulating film by plus sizing of the insulating film upon formation of the insulating film. Then, the insulating film is formed on the wiring pattern and the dummy patterns.

Here, the plus sizing of the insulating film is to deposit an insulating film material not only on a pattern upper surface but also on pattern sidewalls upon vapor phase growth of the insulating film and increase the size of each pattern at a predetermined rate. The width of each of the pattern non-forming regions of the dummy patterns is equivalent to the shortest distance between the pattern sidewalls at individual points lying in the pattern non-forming regions.

Therefore, since the pattern non-forming regions are filled with the insulating film material which is deposited on the pattern sidewalls upon vapor phase growth of the insulating film, the coverage of the insulating film remains unchanged at dummy patterns (conventional dummy patterns) which are provided with no pattern non-forming regions and the dummy patterns which are provided with the pattern non-forming regions.

When the formed insulating film is planarized, global steps equivalent to ones which are obtained when the dummy patterns provided with no pattern non-forming regions are provided, can be obtained while reducing a pattern ratio by the provision of the pattern non-forming regions at the dummy patterns.

According to the semiconductor device of the present invention and its manufacturing method, an advantageous effect is achieved in that upon insertion of dummy patterns which are different from an actual wiring pattern, a pattern ratio can be prevented from increasing, and the wiring dummy patterns enable an improvement in the global step of CMP.

BRIEF DESCRIPTION OF THE DRAWINGS

While the specification concludes with claims particularly pointing out and distinctly claiming the subject matter which is regarded as the present invention, it is believed that the present invention, the objects and features of the present invention and further objects, features and advantages thereof will be better understood from the following description when taken in connection with the accompanying drawings in which:

DETAILED DESCRIPTION OF THE INVENTION

Figure 1A:
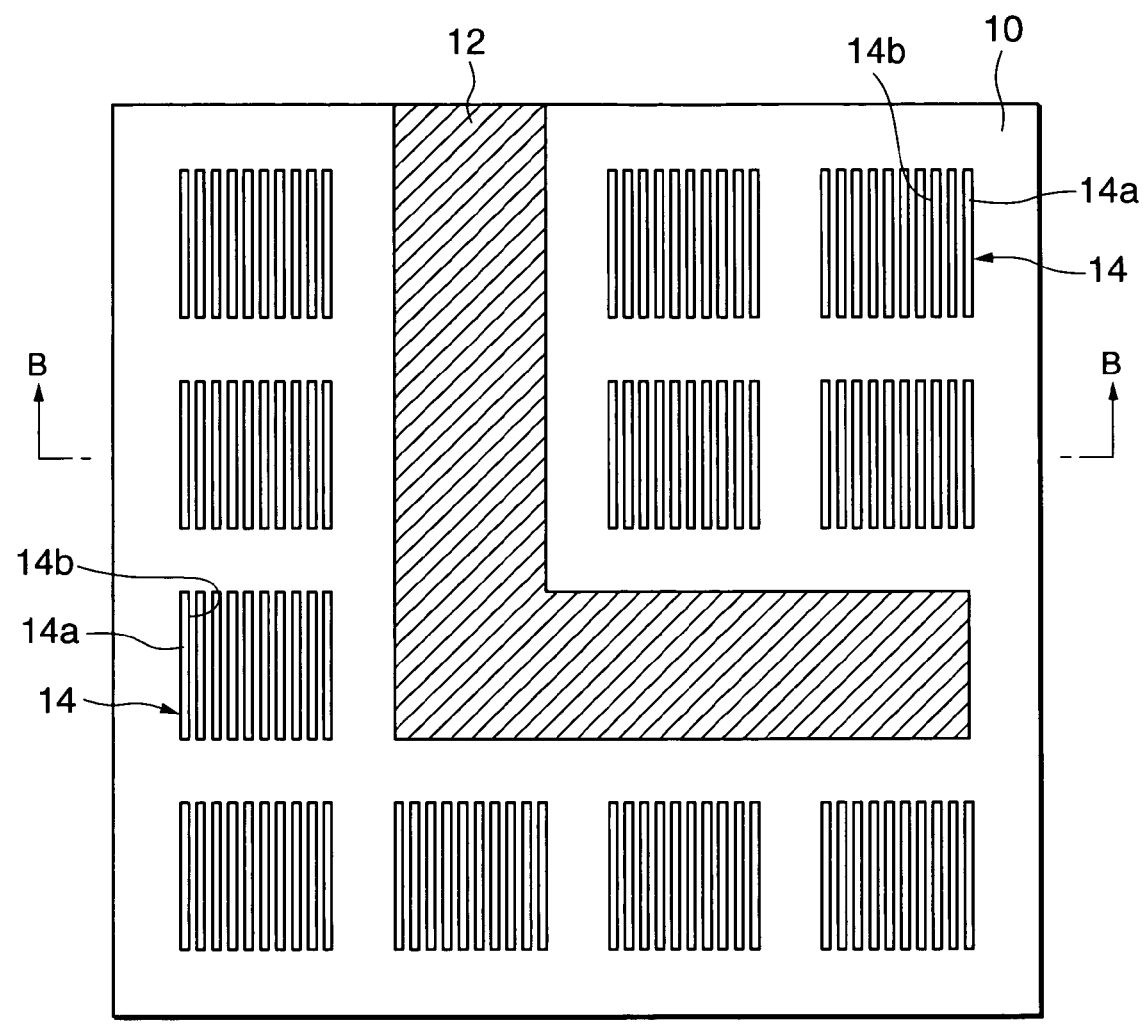
FIG. 1 is a partly plan view (A) and a partly sectional view (B) showing a semiconductor device according to a first embodiment of the present invention.

The present invention will be described hereinbelow with reference to the accompanying drawings. Incidentally, structural components each substantially having the same function will be explained with the same reference numerals given thereto through all of the drawings.

First Embodiment

FIG. 1 is a partially plan view (A) and a partially sectional view (B) showing a semiconductor device according to a first embodiment of the present invention. FIG. 2 is a process view showing a method of manufacturing the semiconductor device according to the first embodiment of the present invention.

Figure 1B:
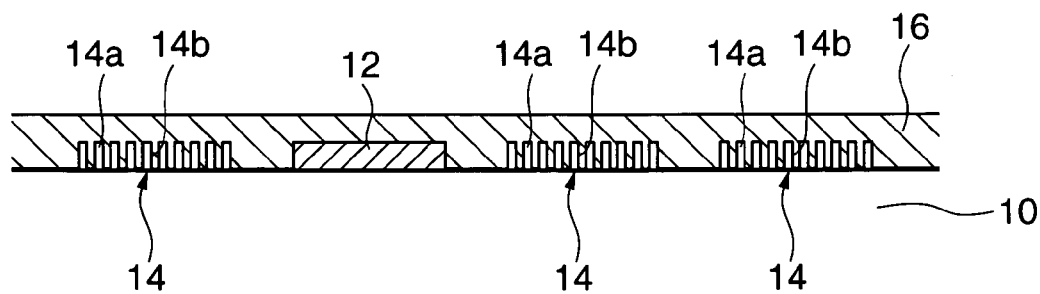

In the semiconductor device according to the first embodiment, as shown in FIG. 1(A), a gate wiring pattern 12 (wiring pattern) is formed on a semiconductor substrate 10, and a plurality of dummy patterns 14 are formed therearound. As shown in FIG. 1(B), a BPSG (Boro Phospho Silicate Glass) oxide film 16 (insulating film) which is planarized by CMP is formed on the gate wiring pattern 12 and the dummy patterns 14 as an interlayer insulating film. Here, FIG. 1(B) is a sectional view taken along line B-B in FIG. 1(A).

In the dummy patterns 14, stripe-like slits 14b (pattern forming regions) are provided among a plurality of linear patterns 14a.

The width of each of the slits 14b provided at the dummy patterns 14 is set so that a width of the slit 14b is filled by plus sizing of each dummy pattern upon formation of the interlayer insulating film. Described specifically, the width which is filled by plus sizing is 72 μm or less, for example.

A method of manufacturing the semiconductor device according to the present embodiment will now be described.

Figure 2A:
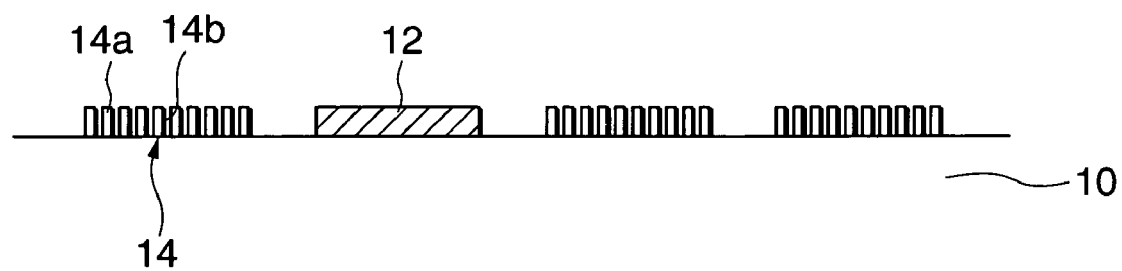
FIG. 2 is a process view illustrating a method of manufacturing the semiconductor device according to the first embodiment of the present invention.
Figure 2B:
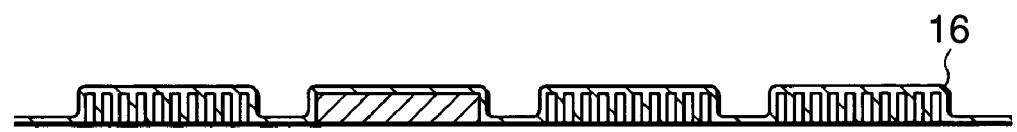
Figure 2C:
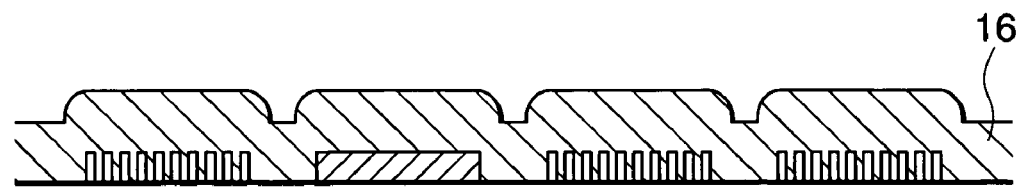

First, a plurality of dummy patterns 14 are formed on a semiconductor substrate 10 together with a gate wiring pattern 12 by using a gate electrode forming mask (see FIG. 2(A)).

Next, a BPSG oxide film 16 is formed on the gate wiring pattern 12 and the dummy patterns 14 by a chemical vapor deposition method. Since plus sizing of the dummy patterns occurs first at this time, a constituent material used for a BPSG oxide film 16 is deposited from the side surfaces of linear patterns 14a so that slits 14b of the dummy patterns 14 are filled (see FIG. 2(B)). Thereafter, a BPSG oxide film 16 is formed (see FIG. 2(C)).

Figure 2D:
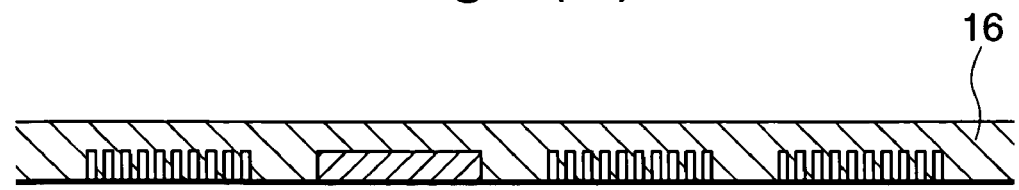

Then, the surface of the BPSG oxide film 16 is smoothed by CMP (see FIG. 2(D)). The semiconductor device is fabricated in this way.

In the first embodiment as described above, the dummy patterns 14 are provided with the slits 14b each having a predetermined width, and the slits 14b are filled by dummy pattern plus sizing upon vapor phase growth of the BPSG oxide film 16. Therefore, the BPSG oxide film 16 is formed at the coverage which is no different from dummy patterns 14 (conventional dummy patterns) with no slits 14b.

Therefore, when the BPSG oxide film 16 is planarized, global steps which are equivalent to ones obtained when the conventional dummy patterns are provided, can be obtained while reducing a pattern ratio by the provision of the slits 14b at the dummy patterns 14.

Since the dummy patterns 14 are arranged in lattice form in the first embodiment, the interval between lattices is varied to make it possible to easily optimize the pattern ratio. It is thus possible to suppress an increase in the global-step more effectively.

Second Embodiment

FIG. 3 is a partially plan view (A) and a partially sectional view (B) showing a semiconductor device according to a second embodiment of the present invention.

Figure 3A:
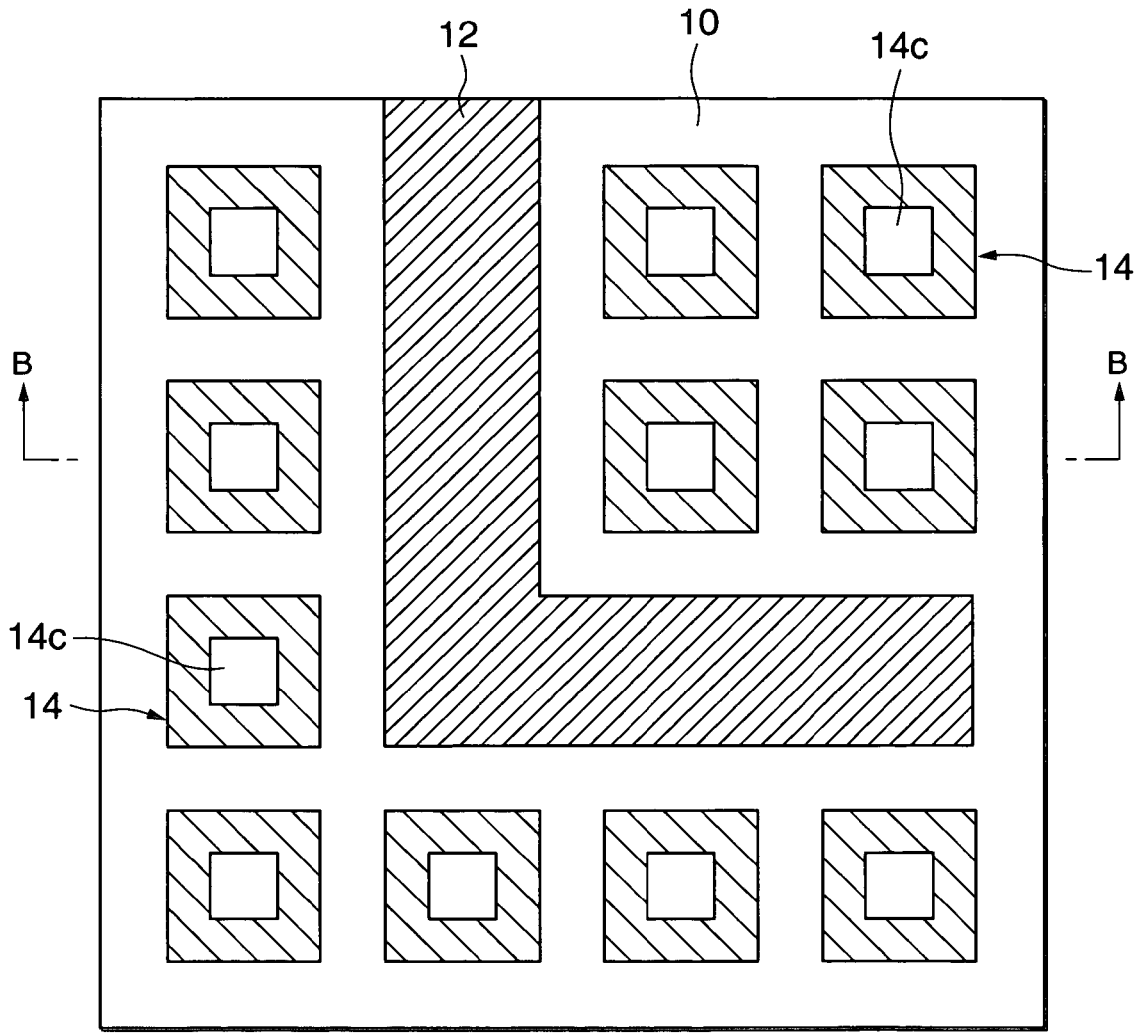
FIG. 3 is a partly plan view (A) and a partly sectional view (B) showing a semiconductor device according to a second embodiment of the present invention.
Figure 3B:
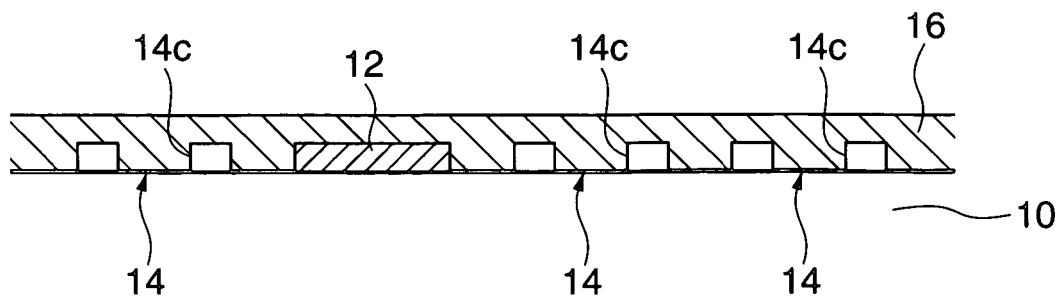

As shown in FIG. 3, the second embodiment takes a form in which arbitrary graphical ("square" in the second embodiment) openings 14c (pattern non-forming regions) are respectively provided at the centers of square (square-shaped) dummy patterns 14. Here, FIG. 3(B) is a sectional view taken along line B-B in FIG. 3(A). Since elements of structure other than the above are similar to those employed in the first embodiment, the description thereof will be omitted.

The first embodiment has explained the form in which the plurality of linear patterns 14a have built up the dummy patterns 14 (the dummy patterns 14 provided with the slits 14b) which are arranged at the predetermined intervals. However, since the dummy patterns are constituted of the plurality of linear patterns 14a in this case, the number of graphic forms increases and hence the dummy patterns 14 (linear patterns 14a) are inserted in large numbers. As a result, a problem arises in that since the number of graphic forms increases as compared with the capacity of a design data file (GDS2 data) at the insertion of mere square dummy patterns (dummy patterns 14 with no slits 14b), data capacity is inevitable and its practical handling is inconvenient.

Thus, the square dummy patterns 14 which are provided with the arbitrary graphical openings 14c at their centers are formed to thereby suppress an increase in the number of graphical forms in the second embodiment. The width of the opening 14c is similar to the width of the slit 14b employed in the first embodiment. Also, the form of the opening 14c is not limited to the square but can be configured as any other arbitrary graphical form.

Therefore, the second embodiment is capable of obtaining a global step which is equivalent to one obtained where the conventional dummy patterns are provided, while reducing the pattern ratio by the provision of the opening 14c at each dummy pattern 14, in a manner similar to the first embodiment. Further, the second embodiment is capable of reducing the design data file capacity (GDS2 data) and improving its practical handling.

Third Embodiment

FIG. 4 is a partially plan view (A) and a partially sectional view (B) showing a semiconductor device according to a third embodiment of the present invention.

Figure 4A:
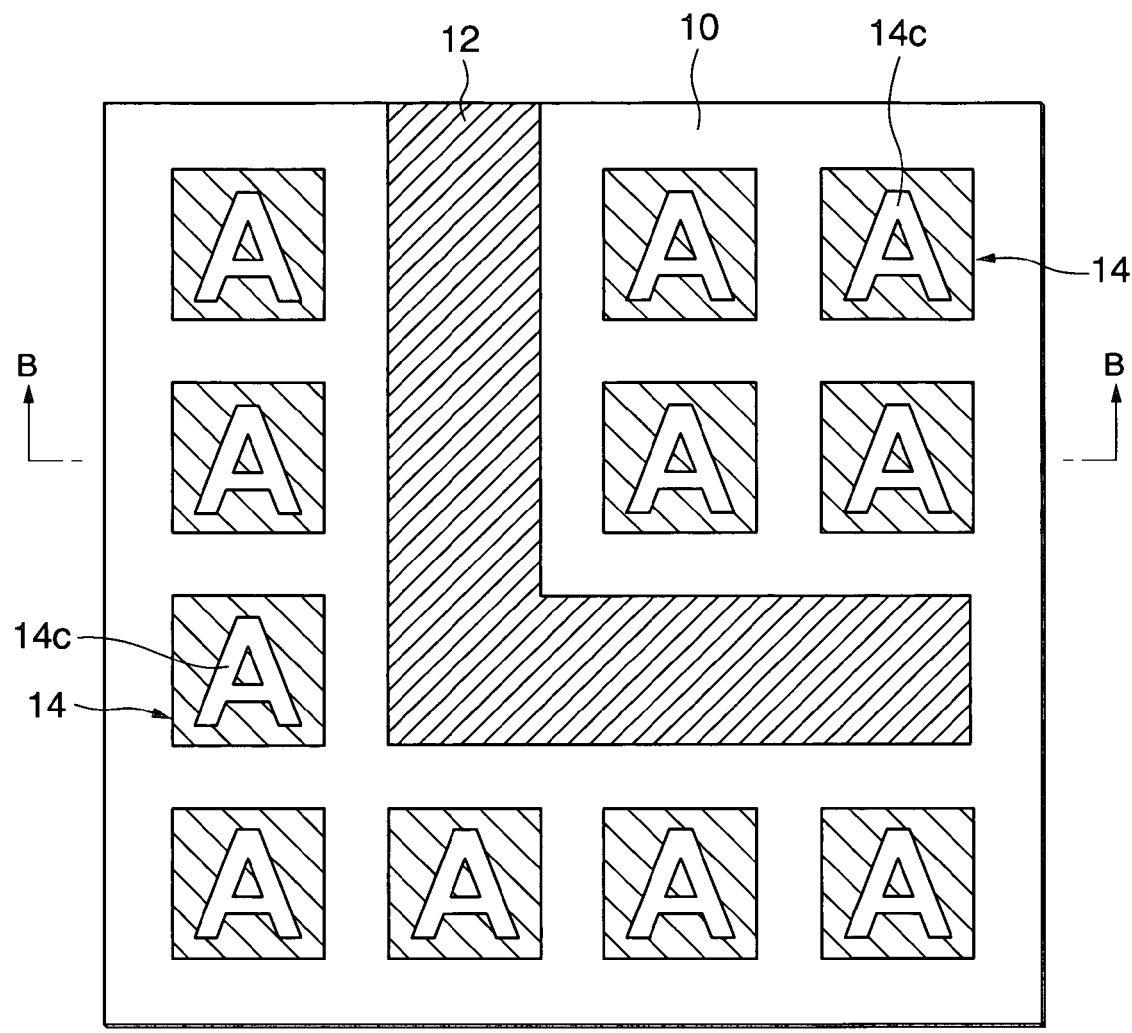
FIG. 4 is a partly plan view (A) and a partly sectional view (B) illustrating a semiconductor device according to a third embodiment of the present invention.
Figure 4B:
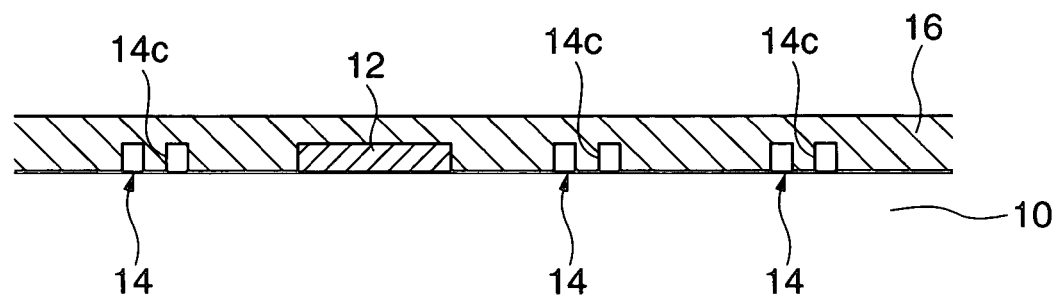

The present embodiment takes a form in which arbitrary character-shaped ("A" in the third embodiment) openings 14c (pattern non-forming regions) are respectively provided at the centers of square dummy patterns 14 as shown in FIG. 4. Here, FIG. 4(B) is a sectional view taken along line B-B in FIG. 4(A). Since elements of structure other than the above are similar to those employed in the second embodiment, the description thereof will be omitted.

In the third embodiment, the gate wiring pattern 12 and the dummy patterns 14 can be easily identified since the shapes of the openings 14c are represented in arbitrary character form.

Fourth Embodiment

Figure 5:
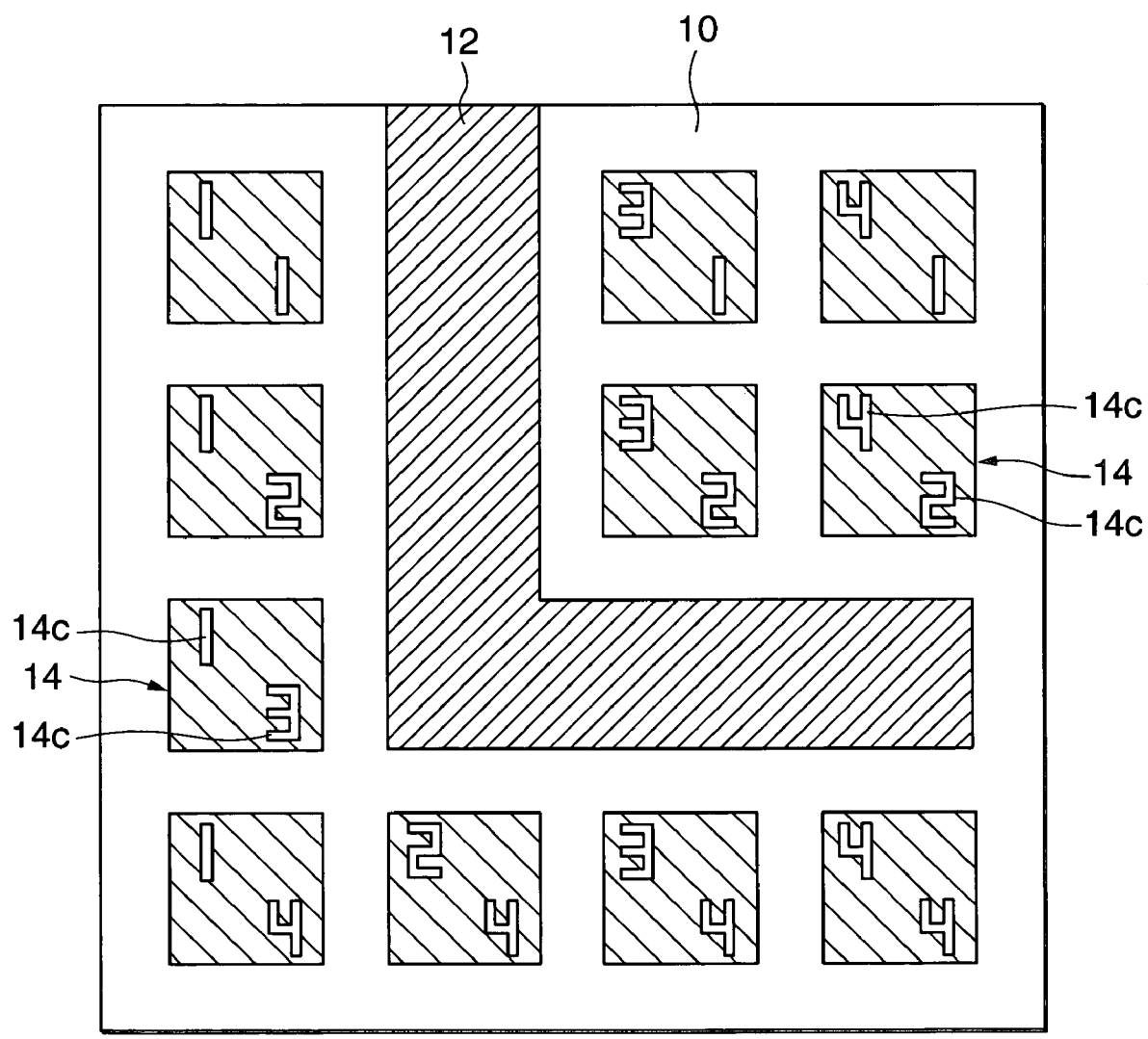
FIG. 5 is a partly plan view depicting a semiconductor device according to a fourth embodiment of the present invention.

FIG. 5 is a partly plan view showing a semiconductor device according to a fourth embodiment of the present invention.

The fourth embodiment takes a form in which square dummy patterns 14 are respectively provided with arbitrary character-shaped or graphical ("numerals" in the fourth embodiment) openings 14c (pattern non-forming regions) which are different for each of the dummy patterns 14 as shown in FIG. 5. Since the fourth embodiment is similar to the third embodiment except for the above, the description of the similar elements of structure will be omitted.

Since the shapes of the openings 14c are set to the character-like or graphical forms which are different for each of the dummy patterns 14 in the fourth embodiment, the dummy patterns 14 can be used as addresses. It is thus possible to easily identify a specific pattern lying in the semiconductor device.

Although any of the embodiments has explained the gate electrode pattern as the wiring pattern by way of illustration, the present invention is not limited thereto. The present invention can be applied even to a metal wiring pattern which is formed upon wiring multilayering, 3-dimensioning of a semiconductor device or the like. Although the BPSG oxide film has been described as the interlayer insulating film by way of illustration, the present invention is not limited thereto. For example, one that causes a similar phenomenon, such as a high density plasma CVD (High Density Plasma-Chemical Vapor Deposition: HDP-CVD) oxide film is also applicable.

While the present invention has been described with reference to the illustrative embodiments, this description is not intended to be construed in a limiting sense. Various modifications of the illustrative embodiments, as well as other embodiments of the present invention, will be apparent to those skilled in the art with reference to this description. It is therefore contemplated that the appended claims will cover any such modifications or embodiments which fall within the true scope of the present invention.

What is claimed is:

1. A semiconductor device comprising:
    a semiconductor substrate having a pattern area and a non-pattern area;
    a conductor pattern formed on said pattern area of said semiconductor substrate;
    a plurality of dummy patterns formed on said non-pattern area of said semiconductor substrate;
    an insulating film formed on said conductive pattern and said plurality of dummy patterns;
    wherein said insulating film is formed by a chemical vapor deposition and is smoothed by chemical mechanical polishing;
    wherein each of said plurality of dummy patterns are formed in a plurality of dummy areas, each of said plurality of dummy areas having a same shape, and each of said plurality of dummy patterns being arranged in a matrix with predetermined spacing;
    wherein each of said dummy patterns has a space portion within each of the dummy areas so that a pattern ratio of said semiconductor device is reduced;
    wherein each of said dummy patterns includes an opening at the space portion, the opening having a shape of a letter or a number, each opening of said dummy patterns having a width less than 72 μm; and
    wherein the openings of the dummy patterns each have a shape different from one another.

2. A semiconductor device according to claim 1, wherein each of said dummy patterns has a rectangular outline.

3. A semiconductor device according to claim 2, wherein each opening has a shape of a plurality of letters.

4. A method of manufacturing the semiconductor device of claim 1, the method comprising:
    forming the conductor pattern and the dummy patterns above the semiconductor substrate;
    forming the insulating film on the conductor pattern and the dummy patterns by chemical vapor deposition, the opening of each dummy pattern being filled by the insulating film; and
    smoothing the insulating film by chemical mechanical polishing.

5. The method according to claim 4, wherein the insulating film is Boro Phospho Silicate Glass (BPSG) oxide film.

6. The method according to claim 4, wherein the insulating film is High Density Plasma-Chemical Vapor Deposition (HDP-CVD) oxide film.

* * * * *